US 6,404,503 B1

(12) United States Patent
Sardo

(10) Patent No.: US 6,404,503 B1
(45) Date of Patent: Jun. 11, 2002

(54) APPARATUS WITH A RETRACING OPTICAL CIRCUIT FOR THE MEASUREMENT OF PHYSICAL QUANTITIES HAVING HIGH REJECTION OF ENVIRONMENTAL NOISE

(75) Inventor: Umberto Sardo, Colturano (IT)

(73) Assignee: Telefo Sistemi S.r.l., Trezzano Rosa (IT)

( * ) Notice: Subject to any disclaimer, the term of this patent is extended or adjusted under 35 U.S.C. 154(b) by 0 days.

(21) Appl. No.: 09/284,548
(22) PCT Filed: Oct. 17, 1997
(86) PCT No.: PCT/EP97/05725
  § 371 (c)(1),
  (2), (4) Date: May 14, 1999
(87) PCT Pub. No.: WO98/17976
  PCT Pub. Date: Apr. 30, 1998

(30) Foreign Application Priority Data

Oct. 17, 1996 (IT) .......................................... TO96A0850

(51) Int. Cl.⁷ .................................................. G01B 9/02
(52) U.S. Cl. ....................................... 356/477; 356/491
(58) Field of Search ................................. 356/477, 481, 356/482, 483, 491, 492, 493, 494

Primary Examiner—Frank G. Font
Assistant Examiner—Andrew H. Lee
(74) Attorney, Agent, or Firm—Levine & Mandelbaum

(57) ABSTRACT

Apparatus for the measurement of physical quantities, of the type using an optical transducer to transform the variations of a physical quantity or perturbation in a variation of the state of polarization of a polarized light beam, in which: the transducer is inserted in an optical circuit, provided with polarizing beam-splitters for splitting the light beam in components having different state of polarization and to launch them along a first optical path and a second optical path, being different to each other, which are recombined in further polarizing beam-splitters arranged at the output of the optical circuit; at the output of the optical circuit a reflector element is provided that reflects the light beam back into the optical circuit with a different state of polarization.

24 Claims, 4 Drawing Sheets

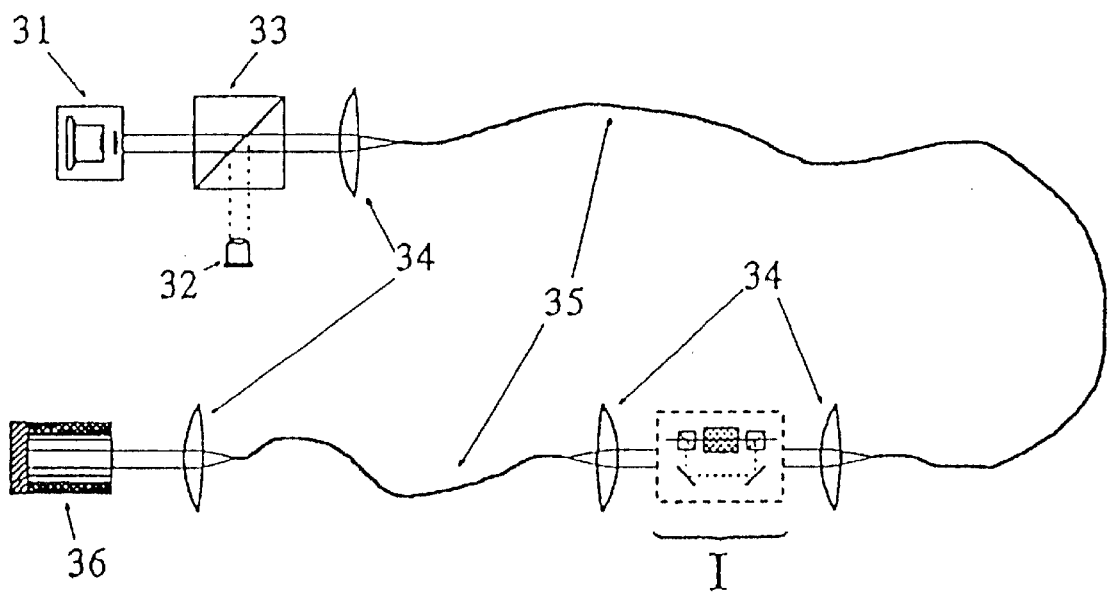
FIG. 3
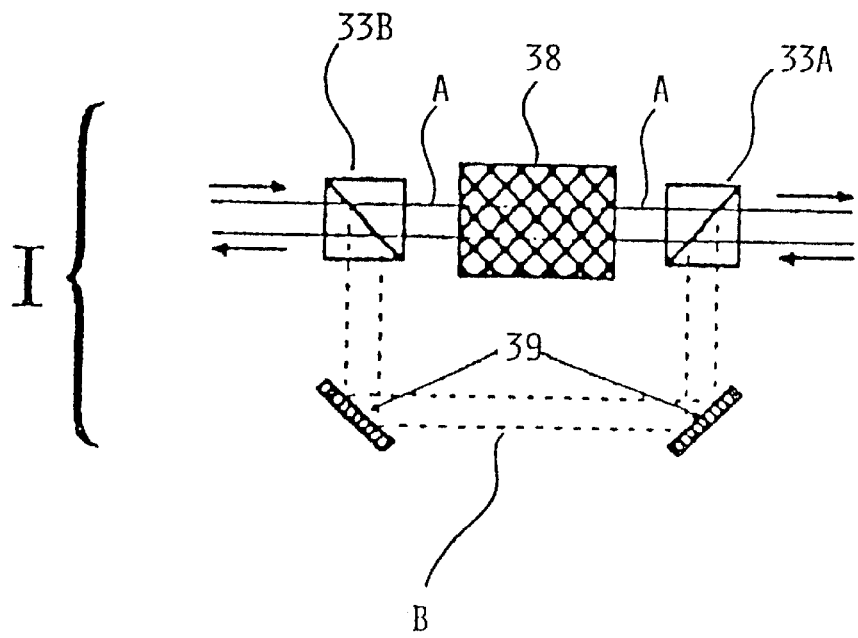

APPARATUS WITH A RETRACING OPTICAL CIRCUIT FOR THE MEASUREMENT OF PHYSICAL QUANTITIES HAVING HIGH REJECTION OF ENVIRONMENTAL NOISE

DESCRIPTION

The present invention refers to an optical sensor for measuring physical quantities, having high rejection of undesired environmental disturbances and noise.

Said sensor converts said physical quantities in changes of the state of polarization of the light propagating within it.

In polarimetric sensors systems, wherein the information concerning the entity of the measured quantity is modulated in the polarization state of the light, the problem exists to control the light polarization both in the sensor and the transmission line of the signal modulated in polarization, which is usually realized by mean of optical fibers.

This effect is increased when optical fibers are used to connect the various optical parts of the system and for realizing the transmission line of the signal modulated in polarization. In fact, environmental parameters, such as vibrations, stress, strain, pressure and temperature variations modify the fiber birefringence and consequently change the state of polarization of the light beam guided in the optical fiber itself. For real in-field operation, for instance in typical industrial environments, of any fiber optic sensor systems, it is therefore necessary to reduce the disturbances and the related measure errors caused the environmental conditions.

Various systems have been proposed in order to avoid or reduce said errors.

For instance, a known approach is that of using special optical fibers, called polarization-maintaining single mode optical fibers. These fibers are able to maintain the state of polarization (linear) of the guided light, but the longer is the fiber length, the lower is the polarization level they allow to maintain.

A second known solution consists in using active or passive compensation methods, being able to take the polarization state of the light in the desired condition, so compensating the undesired environmental noise.

Actively compensated systems are therefore known, which need an optical device, usually powered by electrical signals, for introducing a suitable correction. The amount of the correction is derived from a previous analysis of the signal. However, the necessity of using electric wires for conveying the correction and control signals reduces the electromagnetic insensitivity proper of the method being based on optical sensor only; moreover, the necessity of a first elaboration of the signal for obtaining the necessary correction introduces a reduction of the band passing in the system, due to the analysis times.

Often actively compensated systems are dynamically limited by the maximum error value they can correct.

In document WO95100046 a system is described wherein the light coming out from a Faraday sensor is splitted in two light beams having different linear polarization. Said components are converted in intensity variation of an electric current, and then are normalized and processed for obtaining a final signal that is insensitive to temperature changes of the sensor. However said system realizes an immediate conversion of the optical signal into an electrical signal, which is consequently exposed to electromagnetic noise; also, the system works only for AC measurements.

Passively compensated systems are also known, in which the signal correction is realized by means of particular signal processing and/or optical configurations. For example US.5008611 describes a particular designing method to calculate the proper orientation of the optical means constituting the sensor, so that the effects of the birefringence on the optical means can be minimized with respect to the contribution of the Faraday effect.

To reduce the magnitude of the disturbances, systems are also known that transduce the information using the modulation of the light intensity instead of its state of polarization. In fact, in this case, the light intensity is far less sensitive that the light polarization to the same environmental disturbance. However, the sensor systems that transduce physical perturbations in modulation of the intensity of the light signal are less sensitive than the analogous polarimetric type, and often they are also less linear and present a reduced dynamic range.

Methods are also known for canceling reciprocal disturbances. An optical configuration being particularly interesting for realizing this fact is constituted by a retracing optical circuit. In said retracing optical circuit, the light travels two times, in both directions (forward and return), along the same optical path: an optical fiber with a mirror at one of its ends is a common example of retracing system.

In these optical systems, the perturbation effects acting on the fiber are added during the two travels (forward and return) in a well defined way, which depends either upon the birefringence changes and the initial state of polarization.

It is also known that when a particular device called orthoconjugate reflector replaces the mirror, in every point of the, optical circuit the state of polarization of the counterpropagating light beam is orthogonal with respect to the forward propagating one. In the particular case of an optical fiber, the polarization state exiting the same is orthogonal with respect to the incoming one. Generally speaking, an orthoconjugating reflector is an optical device that reflects back a light beam orthogonally polarized with respect to the incident one. A practical embodiment of such a device is the so-called Mirrored Faraday Rotator (MFR): it is built with a Faraday rotator of 45° of rotating power, followed by a mirror. This device compensates every disturbance of whatever magnitude, only if it is reciprocal, i.e. it does not depend on the direction of propagation of the light. A non-reciprocal effect, as the Faraday effect itself, invalidates the ability of this optical circuit to compensate birefringence changes.

The present invention has the purpose of solving the above mentioned drawbacks and to indicate an apparatus being able to measure different physical quantities with high rejection to environmental disturbances.

Within this frame, the aim of the present invention is to realize an apparatus being able to measure physical quantities or perturbations, by transducing them in variations of the state of polarization of an optical signal, and then in variations of the light intensity, in order to reduce the sensitivity of the whole apparatus to environmental disturbances and to the initial state of polarization of the light beam. Another aim of the present invention is to realize an apparatus being able to measure physical quantities or perturbations by transducing them in variations of the state of polarization and thereafter in variations of the light intensity, including a transducer having a high rejection to the environmental noise.

For attaining these aims, the subject of the present invention is an apparatus for measuring physical quantities having the features of the annexed claims.

Further aims, characteristics and advantages of the present invention will result in being clear from the following detailed description and the annexed drawings, which are supplied as an explicative and not limiting example, wherein:

FIG. 3 shows a detailed diagram of the embodiment of FIG. 1;

Figure 1:
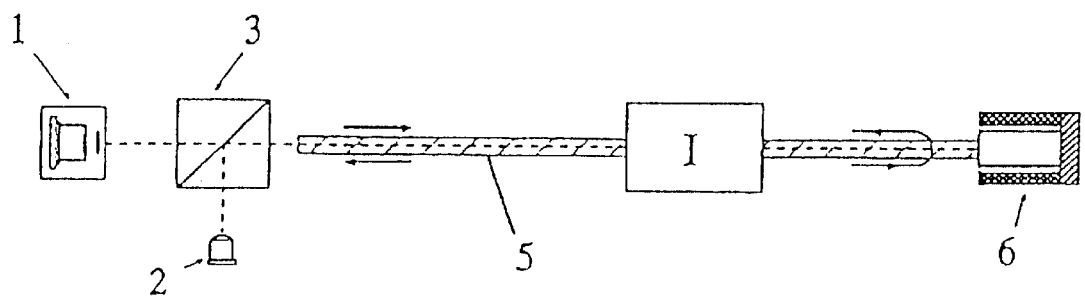
FIG. 1 shows a basic schematic diagram of the measuring apparatus according to the present invention.

In FIG. 1 an optical source 1 is represented which produces a collimated light beam, being incident on a polarizing beam-splitter 3. Said polarizing beam-splitter 3 is able to split the incident light beam in two distinct beams having orthogonal states of polarization and two orthogonal directions, the first one along the reflection direction, and the second one along the transmission direction.

Consequently, one of the two beams, i.e. the reflected one, is directed out from the optical system, while the other polarized optical beam, i.e. the transmitted one, reaches a sensor I along an optical path 5.

In general, the state of polarization of the light at the input of the sensor I will be arbitrary, depending upon the characteristics of the optical medium; this polarization will also vary depending upon the environmental perturbations acting along the optical path 5.

The sensor I has the purpose to translate the physical quantity under measurement in a proportional variation of its dichroism; therefore, the light exiting sensor I, besides having a new polarization state, also has a reduction of intensity being proportional to the measured physical quantity or perturbation. The output signal goes onto a polarization orthoconjugating reflector 6, which reflects it back towards the sensor I. The particular properties of the orthoconjugating reflector 6 produce a polarization state of the light that re-enters the sensor I being orthogonal with respect to the light that exits from the sensor I.

Since the dichroism of the sensor I is of the reciprocal type, the polarization component that was unaffected during the first passage through the sensor I, will now be reduced.

Consequently, at the output of the sensor I a light will be obtained having a polarization state being orthogonal with respect to the light entering the sensor, but having an intensity which is reduced proportionally to the measured physical quantity or perturbation. Moreover, the total attenuation is independent from the state of polarization of the light entering the sensor I.

The intensity modulated light-signal finally backpropagates along the optical path 5 and similarly has an orthogonal state of polarization with respect to the beam transmitted by the polarizing beam-splitter. Therefore it will be directed by the polarizing beam-splitter 3 on a photodetector 2 that will transduce the intensity modulation of the light beam in a proportional variation of an electrical current in exit. The reduced sensitivity to environmental disturbances of this optical circuit will be shown in a more detailed way with reference to FIG. 3.

Figure 2:
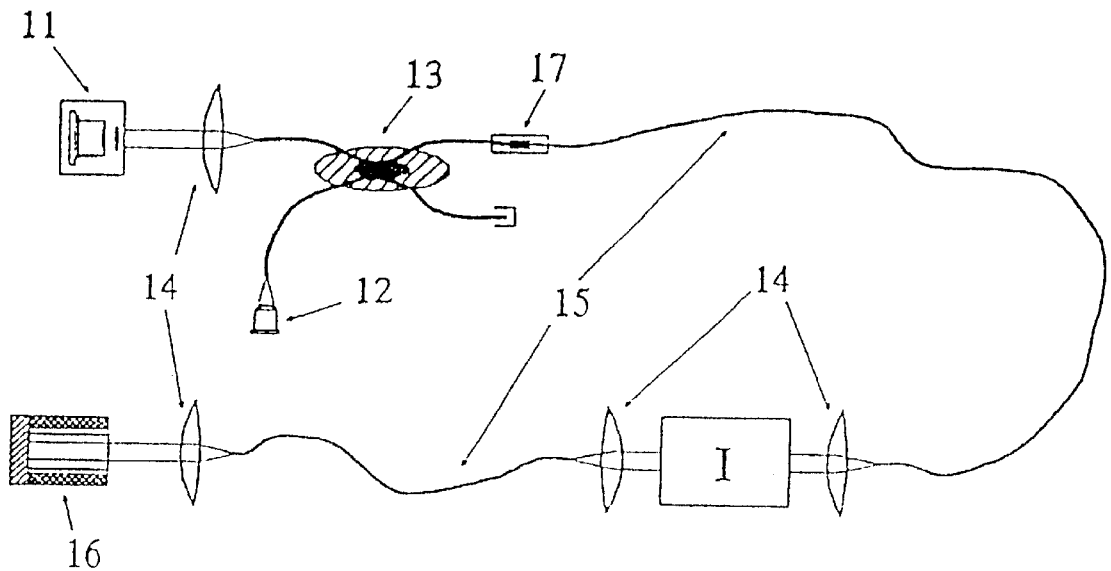
FIG. 2 shows a basic schematic diagram of a second possible embodiment of the present invention.

Due to the easiness of transporting optical signal to remote places and its reduced attenuation, an optical fiber may be conveniently used to connect the light source 1 with the sensor I, and eventually the sensor I with the orthoconjugating reflector 6. Consequently, in FIG. 2 is shown an optical circuit being equivalent to that of FIG. 1, being however realized by using an optical fiber. The optical devices already shown in the a figure are indicated with the same numbers, to which the factor 10 is added (i.e. the optical source 1 of FIG. 1 will be the optical source 11 in FIG. 2, etc.); a new description of the various elements is consequently omitted.

The light coming out from the optical source 11 is launched by a lens 14 in a polarizing beam-splitter 13 made with optical fibers; this devices is also called polarization-maintaining fiber optic coupler. One of the output ends of said polarizing beam-splitter 13 is connected with the optical fiber 15 by an optical joint 17; said optical fiber 15 can be of any type, but it should not be subject to non reciprocal effects; other lenses 14 are arranged in the optical circuit for focusing the light in the optical fiber 15 or for collimating it in the exit of the lens, but the essential operation of the circuit remains the same.

By the proposed optical circuit it is therefore obtained a measure of the physical quantity or perturbation of interest, linked only to the dichroism induced in the sensor I, but the measurement is independent from the polarization noise induced by the environmental disturbances on the optical fibers.

The optical scheme of a generic sensor of physical quantities according to the proposed invention is shown in FIG. 3, along with a possible realization of the sensor I.

By examining in detail said sensor, it can be noticed that the light exiting the first length of optical fiber 35 is collimated by the lens 34 and then goes on a polarizing beam-splitter 33A. The two orthogonally polarized components are sent along an optical path A to a transducer 38 and along an optical path B to a mirror 39, respectively.

The optical transducer 38 is a device for translating the physical perturbation to be measured into a proportional change of the polarization of the light propagating inside it. Said effect might be reciprocal or non-reciprocal, and among the physical quantities or perturbations that can be measured, there are the electric field, the magnetic field (and so the electric voltage and current) and the temperature. Due to the change of the state of polarization of the light after passing the transducer 38, only a part of this light, and namely its component along the original polarization direction before the passage through the transducer 38, will be transmitted by the second polarizing beam-splitter 33B outside the sensor I, with the result of obtaining an attenuation of the signal being proportional to the measured physical perturbation.

The second beam coming from the reflection on the polarizing beam-splitter 33A is reflected by the two mirrors 39 and by the polarizing beam-splitter 33B. The second light beam is recombined at the polarizing beam-splitter 33B with the component of the light which has been attenuated by means of the passage through the transducer 38.

The beam exiting the sensor I is then focused by the lens 14 in the optical fiber 35, towards the orthoconjugating reflector 36.

Due to the properties of said device, the light reflected by it and back-propagated in the optical fiber 35 will go again at the input of the sensor I on the polarizing beam-splitter 33B, but with orthogonal polarization: the light component that, during the first travel, passed through the transducer 38 and had been attenuated, will now be reflected towards the two mirrors 39 and will exit without any attenuation. On the contrary, the previously unattenuated component will now pass through the transducer 38 and therefore it will undergo an attenuation being proportional to the physical quantity or perturbation to be measured: said device therefore operates like the previously described dichroic sensor I.

The light exiting the optical fiber 35 on the polarizing beam-splitter 33 will be orthogonally polarized with respect to the entering one, and an intensity being proportional to the measured physical quantity, but unaffected by polarization noise induced by environmental disturbances. In fact, the assembly of the optical fiber 35 and the polarization orthoconjugating reflector 36 realize a retracing optical circuit that, as mentioned, exploits a high rejection to reciprocal disturbances. Moreover, due to the use of the polarization orthoconjugating reflector 36, an orthogonal change of the light which follows the path in the fiber 35 is determined.

Since this light has an orthogonal polarization with respect to the forwarding path, it will be completely reflected by the polarizing beam-splitter over the photodetector 32.

The proposed system can be modified depending on the particular measurement needs and/or for dimensional constraints. For example, the second length of optical fiber 35 between the sensor I and the orthoconjugating reflector 36 can be removed, without affecting the operation of the system, so saving two lenses and giving a more compact device.

Figure 4:
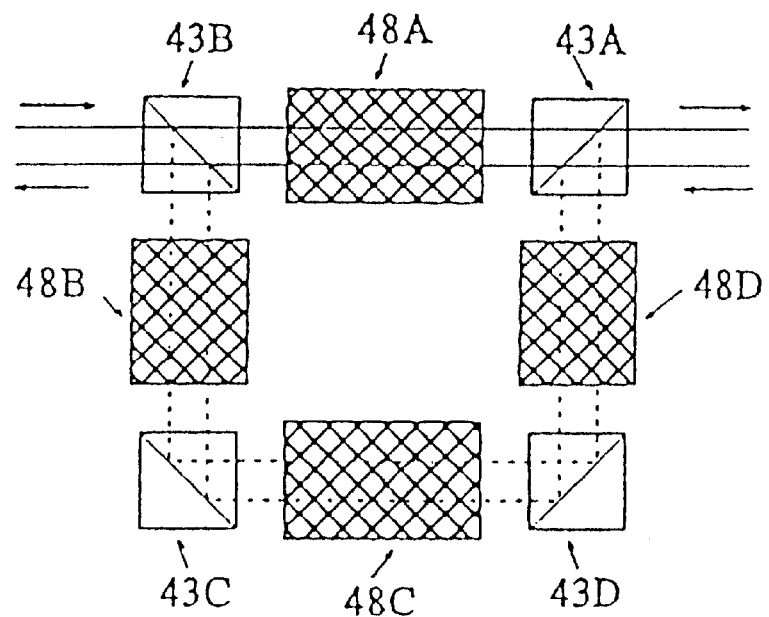
FIG. 4 shows a diagram of a first variant embodiment of a part of the embodiment of FIG. 3.
Figure 5:
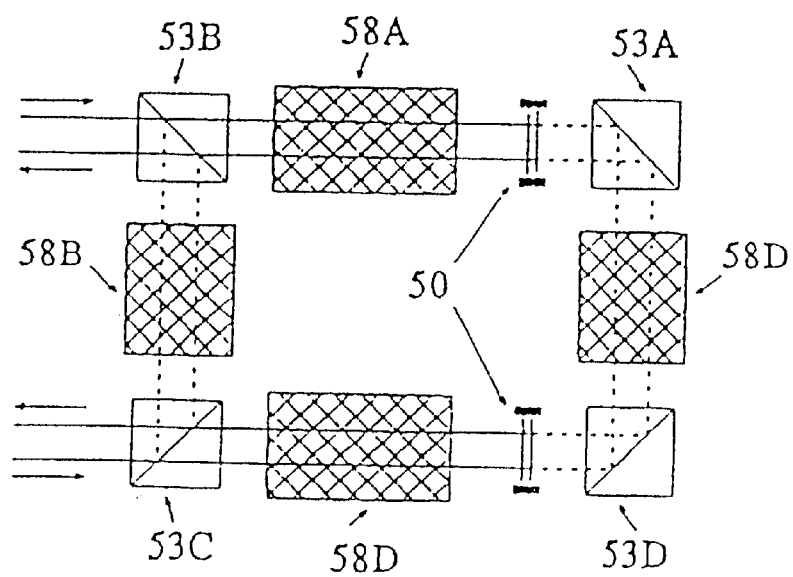
FIG. 5 shows a diagram of a second variant embodiment of a part of the embodiment of FIG. 3.

In FIG. 4 a possible changes of the sensor I is shown. Here the two mirrors 39 have been replaced by two further polarizing beam-splitters 43C and 43D, and three more transducers 48B, 48C, 48D have been added. In this way a polarization component passes through the transducer 48A, as in the previous case, while the other component is made subject to further splitting and polarization rotation by means of the further polarizing beam-splitters 43C and 43D and transducers 48B, 48C, 48D, which operate in a way being similar to that describe with reference to FIG. 3. Different and distinct physical quantities can now be measured at the same time. FIG. 5 is similar to FIG. 4, but two half-wave plates 50 have been added, having a delay of 180°: they are oriented with their fast axes at 45° with respect to the principal axes of the polarizing beam-splitters 53A, 53B, 53C, 53D. By this addition it is possible to obtain a different arrangement of the optical signal input and output ports for the sensor I, when it is necessary, due to the geometry of the system wherein the sensor I is used, to have the input and the output on the same side. For whole optical fiber realizations, it is possible to use optical fiber polarizing beam-splitters, and connecting lengths realized in polarization-maintaining optical fibers.

Figure 6:
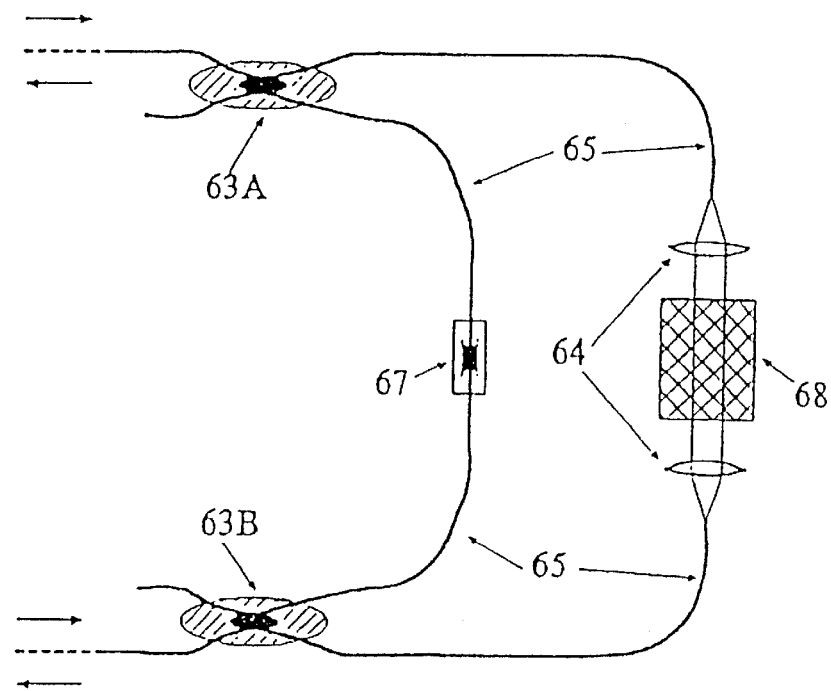
FIG. 6 shows a diagram of a third possible embodiment of the present invention.

In FIG. 6 the two polarizing beam-splitters 63A and 63B are realized in optical fiber; the optical transducer 68 is positioned between two outputs, of the beam-splitters 63A and 63B, with interposition of two lenses 64, while the other two outlet ports of the beam-splitters 63A and 63B are connected via an optical joint 67. The axis of the polarization-maintaining optical fibers realizing the terminals of the polarizing beam-splitter 63A or 63B are oriented in a suitable way depending upon the type of application.

It is also possible to replace the optical joint 67 by a second transducer for realizing the measurement of two different physical quantities.

Figure 7:
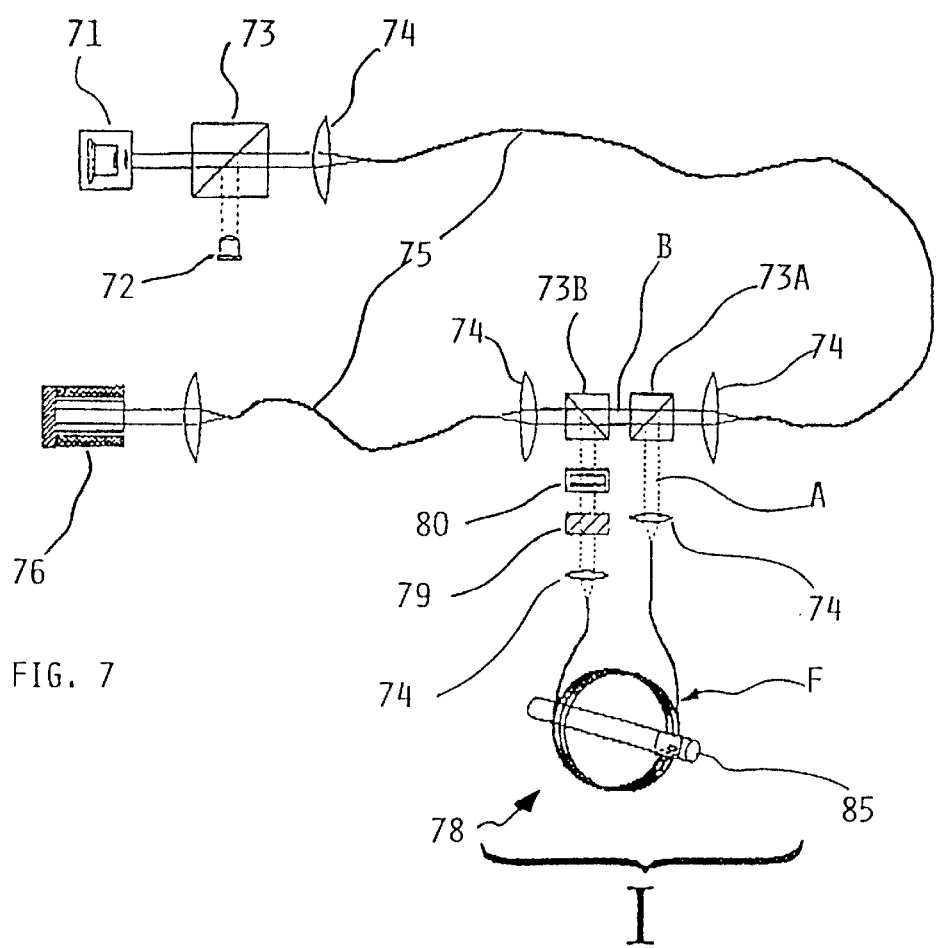
FIG. 7 shows a diagram of a third variant embodiment of a part of the embodiment of FIG. 3.

It is also possible to realize a configuration providing for the joint use of polarizing beam-splitters according to conventional optics (microoptical components), connected by means of optical fibers, possibly of the polarization-maintaining type. A preferred embodiment of the invention is shown in FIG. 7, wherein the sensor I is designed to highly reduce the sensitivity to environmental perturbances. The optical circuit is basically the same as presented in the previous figures, with the optical source 71, the polarizing beam-splitters 73A, 73B, 73C, the photodetector 72, the optical path 75, the polarization orthoconjugating reflector 76 and the lenses 74. Contrary to the embodiments shown in the previous figures, in this case the light which is not reflected by the polarizing beam-splitter 73A follows the optical path B, then reaches the polarizing beam-splitter 73B and goes out without any change; the deflected and orthogonally polarized light beam is directed on the optical path A, onto which transducer 78 is arranged.

This transducer is formed by some coils of optical fiber F wounded around an electrical conductor 85. The transducer 78 converts in this case the magnetic field produced by the current flowing in the electrical conductor 85 in a proportional rotation of the direction of polarization of the light guided by the optical fiber F. In exiting the transducer 78, the optical beam is collimated to an optical plate 79 made of optically active material and on a Faraday rotator 80.

Said Faraday rotator has a variable rotating power, in function of the rotation which is desired. Alternatively, instead of the Faraday rotator 80, a linear birefringent plate can be used, which supplies a similar variable rotation of the polarization state of the light beam, even if with a lower noise insensitivity. The plate 79 made of optically active material is used for obviating the sensitivity of the transducer 78 to environmental perturbations, in particular to temperature variations.

It is known that, within the transducer 78, being realized in optical fiber wounded around the conductor 85 as showed in the figure, during the wounding and tensioning operation of the optical fiber F, a linear birefringence is generated, which is added to the intrinsic birefringence proper of the optical fiber itself. This fact, as already mentioned, reduces the sensitivity of the sensor to the Faraday effect.

This problem can be eliminated by twisting the optical fiber F around its axis, which causes the introduction of a circular birefringence in the fiber higher than the linear birefringence, so restoring the sensitivity to the Faraday effect.

The circular birefringence is however highly temperature dependent, being proportional to the temperature variations, which can introduce errors in the current measure. A solution for eliminating said errors, consists in twisting clockwise the optical fiber F inserted in the transducer 78 for a half of its length, and the remaining half counterclockwise; with this configuration both the linear birefringence and the dependence form the temperature are minimized.

The optically active plate 79 is introduced to further reduce the sensitivity of the optical transducer 78 to temperature variations, compensating small differences in the two halves of the fiber. The plate 79 introduces a dependence by temperature having an equal value to that introduced by the transducer 78, but having an opposite sign.

The Faraday rotator 80 is used in order to vary the static working point of the transducer 78; it introduces a bias rotation angle and therefore a bias attenuation of the output signal. The offset of the working point so determined allows for instance to eliminate a large DC current contribution, while maintaining an high sensitivity for signals, being variable in time, of reduced value.

The transducer 78 may also be realized with a particular optical fiber F, known as "Spun Fiber", which has a low linear birefringence (being intrinsic or mechanically induced during the wounding of the fiber itself), for having an enhanced rejection to mechanical disturbances such as mechanical vibrations.

An alternative method for determining an equivalent effect of the circular birefringence in the optical fiber F realizing the transducer 78 is that of wounding it in the way of producing a low mechanical stress and a slight bending of the same and realizing in the meantime a variation of the polarization plane for geometrical effects. This can be obtained for example by wounding the optical fiber on a torus having appropriate dimensions.

Finally, a optical fiber F can be used for the transducer 78, whose linear birefringence is reduced by the method known as "annealing" of the fiber coils, which eliminates inner stresses, being sources of birefringence, caused by the torsion.

All these solution allows to reduce the dependence from the temperature.

From the given description the characteristics of the present inventions are clear, as its advantages.

The invention merges the most advantageous characteristics of both polarization and intensity modulation of an optical signal, so that the variation of polarization caused by the physical quantity or perturbation to be measured, which allows for a great sensitivity, is locally converted at the output of the optical sensor in a corresponding change of the intensity of the light beam, which is less sensitive to environmental disturbances, and is then guided by an optical fiber to a simple photoelectric detector.

A further advantage lies in the availability and low price of the needed optical components. The type of optical fiber used for linking the source/photodetector parts to the sensor I is not critical, when it does not present non-reciprocal characteristics concerning the propagation of the polarized light. A standard telecom single mode fiber is the lowest priced solution.

Also the wavelength of the optical source is not critical, providing the matching with all the other optical components and transducers. A laser diode or a telecom LED can be the most convenient choice. The polarizing beam-splitters can be of different types, both "all-fiber" (polarization-maintaining fiber optic) or normal realizations in conventional optics, such as polarizing beam-splitter cubes or calcite splitters. The choice of small beam-splitter cubes is a cheaper one, while allowing good performances of the circuit.

A further advantage of the present inventions is the possibility of using of different transducers for the measurement of different physical quantities.

For the measurement of a voltage or an electric field, the transducer can be an electro-optic crystal plus some birefringent components being positioned with suitable orientation of their optical axis with respect to the polarizing beam-splitters. By applying an electric field, or a potential difference, to the crystal, a rotation of the light polarization is obtained at the output of the system for electo-optic effect. For the measure of lower voltages liquid crystal devices can be conveniently used. For the measurement of magnetic fields or electric currents the transducer can be built with an optical material with high Verdet constant (for example FR-5 glass, or YIG crystal). Due to the Faraday effect, it rotates the state of polarization of the light propagating inside it, in function of the magnitude and the orientation of the magnetic field. For a magnetic field being generated by an electric current flowing in a conductor, it is also possible to use some coils of optical fiber wounded around the conductor, for measuring the current itself.

Even if the last effect is nonreciprocal, the proposed circuit is not affected by said fact.

The measure of temperature can be easily accomplished using as transducer a plate whose birefringence is highly depending on temperature (for example rutile, TiO2). To measure mechanical perturbations, such as pressure, strain and stress, an optical fiber is the most versatile sensor type.

Irrespective of the particular application, the whole sensors family based on the proposed invention presents the following common characteristics:

the chosen transducer codes the physical quantity or perturbation in a corresponding change of the state of polarization of the optical signal; this polarization change is converted in a proportional variation of intensity of the light signal inside the sensor itself: the whole returning signal, intensity modulated, is revealed by a photodetector;

due to the presence of the orthoconjugating reflector, the optical circuit does not require a constant control of the polarization of the light beam in the lengths of optical path leading to the sensor; the circuit is also unaffected by environmental disturbances, such as vibrations, pressures, temperature variations, being present along the same optical path. The rejection of these disturbances is effective till they do not cause any further attenuation of the light signal.

Furthermore, the proposed invention does not need any active device to perform the correction of measure errors, because of the intrinsic automatic compensation of the same.

It should be noticed that, in order to have a good rejection of errors and a correct measure, the flight time of the light within the system, i.e. the time interval elapsing between the passage of the signal in the two directions (forward and return), should be shorter than the minimum time scale of both signal and noise. Therefore, short lengths of optical fiber used as connection and small transducers assure a more extended bandwidth.

It is clear that many changes can be done by the skilled man to the apparatus for the measurement of physical quantities described as an example, without departing from the novelty principles of the invention; it is also clear that in the practical embodiment the shape of the described details could be different from those previously described and the same could be replaced by technically equivalent components.

What is claimed is:

1. Apparatus for the measurement of physical quantities, of the type using a transducer to convert the physical variations of a physical quantity in variations of the plane or state of polarization of a polarized light beam, characterized in that:

the transducer (38; 48A; 58A; 68; 78) is inserted in an optical circuit (I) being provided with polarizing beam-splitter means (33A; 43A; 53A; 63A; 73A;) for splitting the light beam into components having a different state of polarization, and to launch them along a first optical path (A) and a second optical path (B), being different from each other, which meet in further polarizing beam-splitter means (33B; 43B; 53B; 63B; 73B), arranged at the output of the optical circuit (I), which recombine said components;

at the output of the optical circuit (I) a reflector element (6; 16; 36; 76;) is provided which produces a change of the plane of polarization of the light beam and reflects the light beam back in the optical circuit (I).

2. Apparatus for the measurement of physical quantities according to claim 1, characterized in that the transducer (38; 48A; 58A; 68; 78) is arranged on the first optical path (A), while the second optical path (B) is provided with optical elements (39; 67) not affecting the plane of polarization of the light beam.

3. Apparatus for the measurement of physical quantities according to claim 1, characterized in that the reflector element (6; 16; 36; 76) operates an orthogonal variation and/or of 90° of the plane of polarization of the polarized light beam.

4. Apparatus for the measurement of physical quantities according to claim 1, characterized in that the reflector element (6; 16; 36; 76) is an orthoconjugating polarization reflector.

5. Apparatus for the measurement of physical quantities according to claim 1, characterized in that the light beam back-reflected by the reflector element (6; 16; 36; 76) reaches, by an optical path (5) passing through the optical circuit (I) and a further polarizing beam-splitter means (3; 13; 33; 73), a detector of light intensity (2; 32).

6. Apparatus for the measurement of physical quantities according to claim 1, characterized in that the optical circuit (I) comprises two polarizing optical beam-splitters (13A and 13B), two mirrors (19) in the second optical path (B), and a transducer in the first optical path (A) which converts the measured, physical quantity in a change of the plane of polarization of the light beam propagating inside it.

7. Apparatus for the measurement of physical quantities according to claim 1, characterized in that the polarizing beam-splitters (3; 13; 33A; 33B; 43A; 43B; 53A; 53B; 63A; 63B; 73A; 73B) are entirely realized in optical fiber, particularly by means of polarization- maintaining optical fiber couplers and/or the second optical path (B) is realized with an optical joint (67) in optical fiber.

8. Apparatus for the measurement of physical quantities according to claim 1, characterized in that a transducer (38; 48A) is arranged in one of the two optical paths (A), while the other optical path (B) is provided with one or more transducers (48B; 48C; 48D) and one or more optical means (43C; 43D) operating as polarizing beam-splitters.

9. Apparatus for the measurement of physical quantities according to claim 8, characterized in that it comprises two half-wave plates (50), being oriented with their optical axis at 45° with respect to the axis of the polarizing beam-splitters (53A; 53B; 53C; 53D), with the purpose to change the geometrical layout of the inputs and the outputs of the optical circuit (I).

10. Apparatus for the measurement of physical quantities according to claim 1, characterized in that a length of optical fiber (5) is arranged between the optical circuit (I) and the reflector element (6; 16; 36; 76).

11. Apparatus for the measurement of physical quantities according to claim 1, characterized in that the transducer element (38; 48A; 58A; 68) is a transducer being sensitive to electric voltages and/or electric fields variations.

12. Apparatus for the measurement of physical quantities according to claim 1, characterized in that the transducer element (38; 48A; 58A; 68) is a transducer being sensitive to electric currents and/or magnetic fields variations.

13. Apparatus for the measurement of physical quantities according to claim 1, characterized in that the transducer element (38; 48A; 58A; 68) is a transducer being sensitive to temperature variations.

14. Apparatus for the measurement of physical quantities according to claim 1, characterized in that the transducer element (38; 48A; 58A; 68) is a transducer of mechanical quantities or perturbations.

15. Method for measuring physical quantities characterized by the following steps:
   a polarization of a light beam emitted by an optical source;
   b splitting of the light beam in two components having orthogonally polarized state, by means of a polarizing beam-splitter;
   c launching of the two components along two different optical paths, the first one producing a change of the state of polarization being proportional to the quantity to be measured, the second one maintaining its polarization state;
   d recombination of the two orthogonally polarized components of the light beam in a polarizing beam-splitter;
   e reflection of the light beam back and change of its state of polarization to the orthogonal one;
   f repeating steps b, c, d at least once;
   g measure of the intensity of the resulting light beam.

16. Use of a transducer of physical quantities, in particular of electric currents, of the polarimetric type, in the apparatus according to claim 1 wherein:
   said transducer (78) is inserted in an optical circuit being provided with optical devices (3) for splitting the light beam into components having different state of polarization and launching them along two different optical paths (A, B), said optical means (3) being also provided for recombining said components at the output of the optical circuit;
   at the output of the optical circuit (I) a reflector element (6; 16; 36; 76) is provided which produces a change of the plane of polarization of the light beam and reflects the light beam back in the optical circuit (I);
   said transducer (78) is arranged on a first optical path (A) of the optical circuit, while the other optical path (B) does not alter the state of polarization of the light beam propagating in it.

17. Use of a transducer of physical quantities according to claim 16, characterized in that a Faraday rotator (80) and/or a plate of optically active material (79) is provided in the optical path (A) onto which the transducer (78) is arranged.

18. Use of a transducer of physical quantities according to claim 16, characterized in that the transducer (78) is realized by means of an optical fiber wounded around an electrical conductor (85) conducting the electrical current to be measured.

19. Use of a transducer of physical quantities according to claim 18, characterized in that the optical fiber (F) is twisted.

20. Use of a transducer of physical quantities according to claim 19, characterized in that the optical fiber (F) is twisted clockwise for half of its length and counterclockwise for the remaining half.

21. Use of a transducer of physical quantities according to claim 18, characterized in that the optical fiber (F) is a Spun fiber.

22. Use of a transducer of physical quantities according to claim 18, characterized in that the optical fiber (F) is wounded around a torus.

23. Use of a transducer of physical quantities according to claim 18, characterized in that the optical fiber (F) is annealed after having been wounded.

24. Use of a transducer of physical quantities, in particular of electric currents, of the polarimetric type, in the method according to claim 15, wherein:

said transducer (78) is inserted in an optical circuit being provided with optical devices (3) for splitting the light beam into components having different state of polarization and launching them along two different optical paths (A, B), said optical means (3) being also provided for recombining said components at the output of the optical circuit;

at the output of the optical circuit (I) a reflector element (6; 16; 36; 76;) is provided which produces a change of the plane of polarization of the light beam and reflects the light beam back in the optical circuit (I);

said transducer element (78) is arranged on a first optical path (A) of the optical circuit, while the other optical path (B) does not alter the state of polarization of the light beam propagating in it.

* * * * *